United States Patent [19]

Warner

[11] Patent Number: 4,518,998
[45] Date of Patent: May 21, 1985

[54] METHOD AND APPARATUS FOR PRODUCING A TIME ADVANCED OUTPUT PULSE TRAIN FROM AN INPUT PULSE TRAIN

[75] Inventor: Andrew Warner, Harvard, Mass.

[73] Assignee: Klimsch/Optronics, Inc., Chelmsford, Mass.

[21] Appl. No.: 384,476

[22] Filed: Jun. 3, 1982

[51] Int. Cl.³ .......................... H03L 7/08; H04N 3/08
[52] U.S. Cl. .................................... 358/208; 358/206; 331/25; 250/235; 328/155
[58] Field of Search ........................ 331/25; 250/235; 358/206, 208; 328/155

[56] References Cited

U.S. PATENT DOCUMENTS

| | | | |
|---|---|---|---|
| 3,719,780 | 3/1973 | Gazard et al. | 358/206 |
| 3,872,397 | 3/1975 | Hanneman | 331/25 |
| 4,178,064 | 12/1979 | Mrdjen | 250/235 |
| 4,358,740 | 11/1982 | Dinter | 331/25 |
| 4,358,789 | 11/1982 | Confer | 358/208 |
| 4,387,348 | 6/1983 | Fritze | 331/25 |

Primary Examiner—John S. Heyman
Attorney, Agent, or Firm—Thompson, Birch, Gauthier & Samuels

[57] ABSTRACT

A method and apparatus for producing a time advanced pulse train from an input pulse train using a phase locked loop with time delayed feedback. The apparatus is used to generate clock signals that occur at a precise relationship to the position of a scanning or writing laser beam.

9 Claims, 1 Drawing Figure

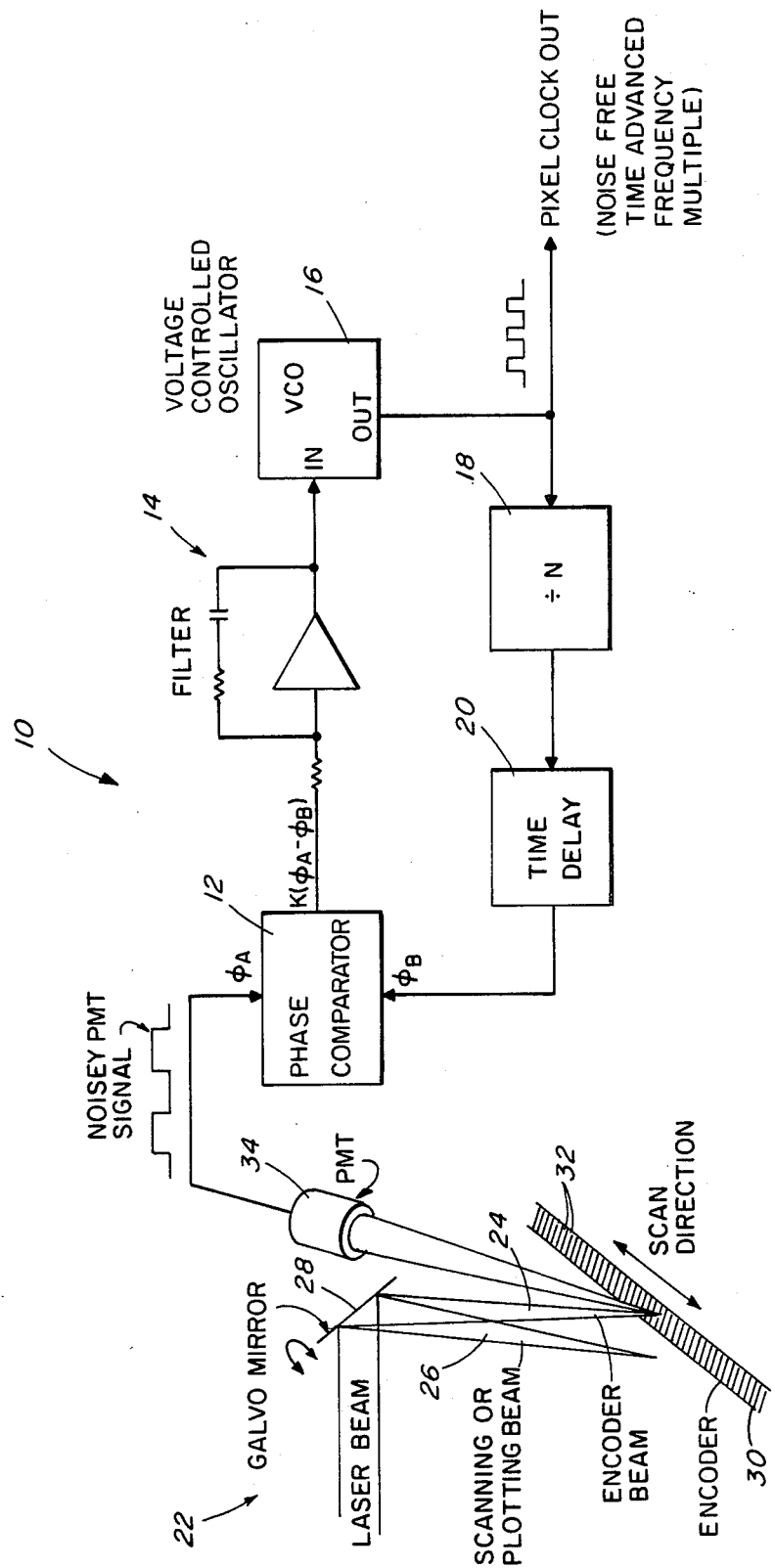

METHOD AND APPARATUS FOR PRODUCING A TIME ADVANCED OUTPUT PULSE TRAIN FROM AN INPUT PULSE TRAIN

BACKGROUND OF THE INVENTION

The present invention relates in general to a method and apparatus for producing clock signals and, more particularly, to a method and apparatus for producing time advanced clock signals from an input pulse train in which the clock signals occur at a precise relationship to the position of a scanning or plotting beam.

Laser beam scanners and plotters are well known to those in the electro-optical industry. In order to accurately place a pixel on film, the laser beam must be turned on at the exact moment that the beam is over the spot where the pixel is to be written. Similarly, in order to scan an image accurately, the sampling mechanism must be activated in the same way. To accomplish this, the laser beam is split into an encoder beam and a scan (or write) beam. Both beams are moved by the same oscillating mirror that forms part of a galvonometer assembly. The encoder beam is reflected from an encoder located just above the film. The encoder, comprising alternating dark and reflective lines, auto-collimates the beam back to the galvonometer mirror and ultimately to a photo multiplier tube. The photo multiplier tube produces current pulses as the laser beam moves from reflective to non-reflective portions of the encoder. These current pulses provide the raw data for generating clocking signals for the scanners' A/D converter, memory and D/A converter. However, since the laser beam is modulated, it is necessary to compensate for the phase delay in the laser modulator.

Accordingly, it is a general object of the present invention to provide a method and apparatus for producing a time-advanced output pulse train from an input pulse train.

It is a specific object of the present invention to provide a method and apparatus for producing a time advanced output pulse train from an input pulse train utilizing a phase locked loop with time delayed feedback.

It is a further object of the invention to provide a time advanced, frequency multiplied output pulse train from an input pulse train.

It is still another object of the present invention to provide a noise free, time advanced, frequency multiplied output pulse train from an input pulse train.

It is a feature of the present invention that the method thereof can be implemented using readily available, conventional, electrical components.

It is another feature of the invention that the apparatus thereof produces clock signals occurring at a precise relationship to the position of a scanning or writing laser beam.

BRIEF DESCRIPTION OF THE DRAWING

These objects and features and other objects and features will best be understood from a detailed description of a preferred embodiment thereof selected for purposes of illustration and shown in the accompanying single FIGURE which is a view in partial diagrammatic and block form of a laser scanner/plotter with a circuit for producing a time advanced output pulse train from an input pulse train.

DETAILED DESCRIPTION OF A PREFERRED EMBODIMENT

Referring now to the single FIGURE, there is shown a phase locked loop (PLL) constructed in accordance with the present invention and indicated generally by the reference numeral 10. The phase lock loop 10 comprises a phase comparator 12, an optional filter 14, a voltage controlled oscillator 16, an optional divide by N circuit 18 and a time delay circuit 20.

The phase comparator 12 has two inputs: phase A which receives an input pulse train and phase B which receives the feedback signal. If there is a difference between the phase A and B signals, an error voltage is generated which causes the voltage controlled oscillator 16 to change its output until the error is reduced to zero. Since phase B is delayed, the VCO is phase advanced with respect to the phase A input pulse train.

The delayed feedback phase lock loop is shown in the single FIGURE in conjunction with a laser beam scanner or plotter shown diagrammatically and indicated generally by the reference numeral 22. The laser beam of the scanner/plotter 22 is split into an encoder beam 24 and a scan (or write) beam 26. Both beams are moved by the same oscillating mirror 28 that is part of the scanner/plotter galvanometer assembly (not shown). The encoder beam 24 is reflected from an encoder 30 located just above the film (not shown) or the scanned original (not shown). The encoder 30 comprises alternating dark and reflective lines 32 which reflect the encoder beam back to a photomultiplier tube 34. A photomultiplier tube 34 produces current pulses as the encoder beam moves from reflective to non-reflective portions of the encoder 30.

A more detailed description of such a scanner/plotter is contained in the application of David Renaud Morrill, Mark T. Mason and Paul Marvin Green for Scanner/-Plotter Optical System filed June 3, 1982 as Ser. No. 384,610 and owned by the same owner as this application. However, for purposes of explanation of the present invention, the above description is sufficient for those skilled in the art.

The current pulses from the photomultiplier tube 34 are inputted to the PLL and constitute the phase A input pulse train to the PLL phase comparator 12. In this configuration, the phase locked loop 10 provides the following four functions:

(1) It produces a continuous, accurate pulse train even in the presence of noise or dirt on the encoder grating. The encoder photomultiplier tube 34 responds to any light hitting it, so that any glint of light or obstruction caused by a speck of dust on the encoder will be converted to a current pulse. Without the filtering action of the PLL 10 these extraneous pulses could go on to falsely trigger succeeding circuitry in the scanner/plotter 22.

(2) The PLL 10 also produces a signal whenever the encoder beam crosses a missing encoder bar. The missing bars are located at spaced predetermined locations along the encoder to provide accurate starting references for the pixel clocking train. A signal from the galvonometer at turnaround or the zero velocity position starts a timer (not shown) which enables a missing bar detector (not shown) after a certain delay. The missing bar is detected whenever there is a signal from the PLL's voltage controlled oscillator 16 and no signal from the encoder. The PLL filter 14 permits the VCO 16 to ride over missing bars and noise on the encoder because it blocks these high frequency abberrations.

(3) A third function of the PLL 10 is to multiply the encoder's spacial frequency. This multiplication is achieved by means of the divide by N circuit 18 located in the feedback path to the PLL phase comparator 12. Since the phase B signal to the phase comparator is both delayed and a submultiple (divide by N) of the VCO and phase B is the same as phase A, the VCO is phased advanced and a multiple of the phase A encoder signal.

(4) The fourth function of the PLL 10 is to provide a pulse train which is advanced in phase to compensate for phase delay in the laser modulator (now shown). The desired phase advance is achieved by inserting the time delay 20 inside the PLL between the VCO 16 and the phase comparator 12.

Having described in detail a preferred embodiment of my invention, it will now be apparent to those skilled in the art that numerous modifications can be made therein without departing from the scope of the invention as defined in the following claims.

What I claim and desire to secure by Letters Patent of the United States is:

1. A method for producing a time advanced output pulse train from an input pulse train comprising the steps of:
   (1) generating an input pulse train;
   (2) generating a feedback pulse train;
   (3) time delaying said feedback pulse train;
   (4) comparing the phase of said input pulse train with the phase of said time delayed feedback pulse train;
   (5) generating a control signal that is a function of the phase difference between said input and time delayed feedback pulse train; and,
   (6) adjusting the phase of said feedback pulse train in response to said control signal whereby said feedback pulse train constitutes a time advanced output pulse train with respect to said input pulse train.

2. The method of claim 1 further comprising the step of dividing by N the frequency of said feedback pulse train before time delaying the feedback pulse train.

3. The method of claim 1 further comprising the step of filtering the control signal before adjusting the phase of said feedback pulse train in response to the filtered control signal.

4. An apparatus for producing a time advanced output pulse train from an input pulse train comprising:
   (1) means for generating an input pulse train;
   (2) means for generating a feedback pulse train;
   (3) means for time delaying said feedback pulse train;
   (4) means for comparing the phase of said input pulse train with the phase of said time delayed feedback pulse train;
   (5) means for generating a control signal that is a function of the phase difference between said input and time delayed feedback pulse train; and,
   (6) means for adjusting the phase of said feedback pulse train in response to said control signal whereby said feedback pulse train constitutes a time advanced output pulse train with respect to said input pulse train.

5. The apparatus of claim 4 further comprising means for dividing by N the frequency of said feedback pulse train with said time delaying means delaying the resulting new feedback pulse train.

6. The apparatus of claim 4 further comprising means for filtering the control signal with said feedback pulse train generating means being responsive to said filtered control signal.

7. A laser beam encoder comprising:
   (1) laser light beam generating means;
   (2) an encoder means having a plurality of alternating laser light beam reflecting and absorbing elements;
   (3) means for scanning said laser light beam across the alternating reflecting and absorbing elements of said encoder means;
   (4) means responsive to the scanned laser light reflected from said encoder means for producing a pulse train signal representation thereof;
   (5) phase comparator means for producing a control signal that is a function of the phase difference between two input signals;
   (6) a feedback pulse train signal generating means responsive to said phase comparator control signal;
   (7) means for time delaying said feedback pulse train signal;
   (8) means for applying said pulse train signal as one input signal to said phase comparator; and,
   (9) means for applying the time delayed feedback pulse train signal to the other input of said phase comparator means whereby said feedback pulse train constitutes a time advanced output pulse train with respect to said input pulse train.

8. The laser light beam encoder of claim 7 further comprising means for dividing by N the frequency of said feedback pulse train signal with said time delaying means time delaying the resulting new feedback pulse train signal.

9. The laser light beam encoder of claim 7 further comprising means for filtering the control signal produced by the phase comparator means with said feedback pulse train signal generating means being responsive to the said filtered control signal.

* * * * *